(12) United States Patent
Allen

(10) Patent No.: US 6,349,034 B2
(45) Date of Patent: Feb. 19, 2002

(54) REMOVABLE HEAT SINK BUMPERS ON A QUAD FLAT PACKAGE

(75) Inventor: Timothy J. Allen, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/846,357

(22) Filed: May 2, 2001

Related U.S. Application Data

(63) Continuation of application No. 09/247,330, filed on Feb. 10, 1999, now Pat. No. 6,252,772.

(51) Int. Cl.[7] ................................................ H05K 7/20
(52) U.S. Cl. ........................................ 361/704; 361/717
(58) Field of Search ............................. 165/80.2, 80.3, 165/185; 174/16.3, 52.2, 675; 257/706, 707, 710, 712–713, 718–719, 726–727; 361/704, 707, 710, 717–718, 722, 735, 744, 813

(56) References Cited

U.S. PATENT DOCUMENTS

| | | |
|---|---|---|
| 4,399,610 A * | 8/1983 | Moyer ........................ 29/827 |
| 4,451,973 A | 6/1984 | Tateno et al. |
| 5,067,006 A | 11/1991 | Marshall et al. |
| 5,367,433 A | 11/1994 | Blomquist |
| 5,615,735 A | 4/1997 | Yoshida et al. |
| 5,660,758 A | 8/1997 | McCullough |
| 5,667,870 A | 9/1997 | McCullough |
| 5,757,075 A | 5/1998 | Kitaoka |
| 5,789,270 A | 8/1998 | Jeng et al. |
| 5,793,613 A | 8/1998 | Poinelli et al. |
| 5,798,570 A | 8/1998 | Watanabe et al. |
| 5,805,430 A | 9/1998 | Atwood et al. |
| 5,807,768 A | 9/1998 | Shin |
| 5,808,359 A | 9/1998 | Muto et al. |
| 5,815,921 A | 10/1998 | Burward-Hoy |
| 5,833,472 A | 11/1998 | Bright |

\* cited by examiner

*Primary Examiner*—Gregory Thompson
(74) *Attorney, Agent, or Firm*—Dickstein Shapiro Morin & Oshinsky LLP

(57) ABSTRACT

A heat sink for a quad flat package comprises a heat-radiating plate and a plurality of removable bumpers attached to the plate. An area of reduced thickness is disposed at the junction between each bumper and the plate to facilitate removal of the plurality of bumpers from the plate. Preferably, each bumper includes an alignment feature for engaging a complementary feature formed on one of a mounting substrate and a test fixture.

17 Claims, 2 Drawing Sheets

REMOVABLE HEAT SINK BUMPERS ON A QUAD FLAT PACKAGE

This is a continuation of U.S. patent application Ser. No. 09/247,330 filed on Feb. 10, 1999 now U.S. Pat. No. 6,252,772, the disclosure of which is incorporated herein by reference.

BACKGROUND OF THE INVENTION

1. Field of the Invention

The present invention relates to integrated circuit quad flat packages and particularly to quad flat packages that include a heat sink with bumpers. More particularly, the invention relates to quad flat packages with removable heat sink bumpers.

2. Description of the Related Art

Quad flat integrated circuit packages are known in the art. Moreover, it is known to attach heat sinks with bumpers to the quad flat packages. For example, U.S. Pat. No. 5,808,359 to Muto et al. discloses a quad flat package that includes a heat-radiating metal plate having bumpers formed at the four corners thereof as a unitary structure. Typically, the bumpers on a quad flat package remain with the package to protect the package leads from damage during handling.

Unfortunately, in conventional quad flat packages, the bumpers take up critical space on a circuit board to which the quad flat package is mounted. The space used by the bumpers could be better used by other components or to reduce the size of the board.

SUMMARY OF THE INVENTION

The present invention overcomes the above-recited disadvantage by providing a quad flat package having removable heat sink bumpers. According to the invention, a heat sink for a quad flat package comprises a heat-radiating plate and a plurality of removable bumpers attached to the plate. An area of reduced thickness is disposed at the junction between each bumper and the plate to facilitate removal of the plurality of bumpers from the plate. Preferably, each bumper includes an alignment feature for engaging a complementary feature formed on one of a mounting substrate and a test fixture.

According to one aspect of the invention, the plate is generally square and the plurality of bumpers includes a plurality of bumper hangers and a bumper head coupled to each bumper hanger. The bumper hangers are attached to the plate and extends outwardly from the plate along a diagonal of the plate. The bumper heads include an alignment feature. In a preferred embodiment of the invention, the plurality of bumpers includes four bumpers, with one bumper attached to each corner of the plate and extending outwardly along a diagonal of the plate. The alignment feature preferably includes an aperture formed in each bumper head.

DETAILED DESCRIPTION OF THE DRAWINGS

Figure 1:
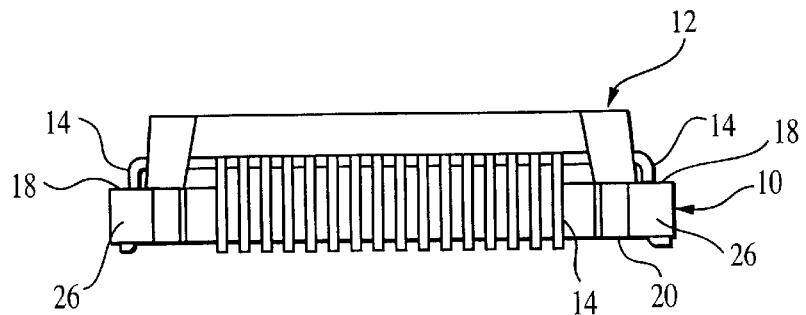
FIG. 1 is a side view of a quad flat package with a heat sink according to the invention.
Figure 2:
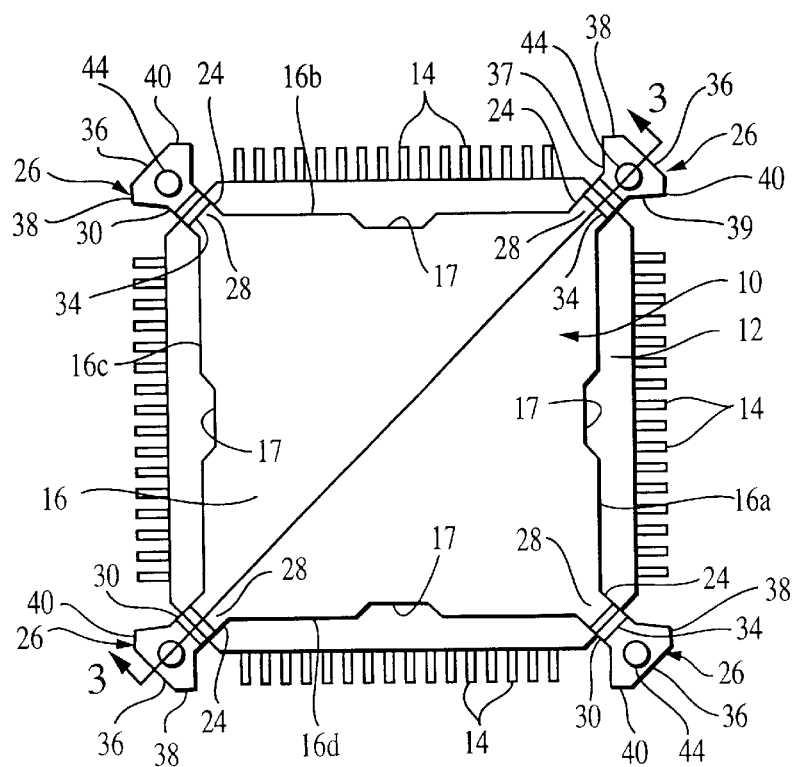
FIG. 2 is a bottom plan view of the quad flat package of FIG. 1.
Figure 3:
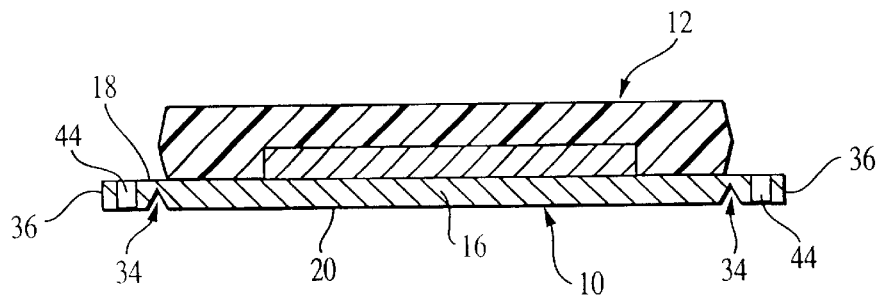
FIG. 3 is a section view taken along lines 3—3 of FIG. 2.

The present invention includes a heat sink 10 attached to a quad flat package 12, as illustrated in FIGS. 1–3. A plurality of leads 14 extend outwardly and downwardly from the quad flat package 12 to connect the package 12 to a circuit board (not shown) or the like.

As best seen in FIG. 2, the heat sink 10 includes a generally square plate 16 defined by sides 16a, 16b, 16c, 16d, a top surface 18 (FIG. 1), a bottom surface 20, a plurality of bumper hangers 24 and a plurality of bumper heads 26. Each side 16a, 16b, 16c, 16d includes a trapezoidal notch 17. Preferably, the heat sink 10 is stamped from a sheet of heat conductive material, but other manufacturing methods and materials can be used.

Each bumper hanger 24 includes a proximal end 28, attached to a corner of the plate 16, and a distal end 30 attached to a bumper 26. Each bumper hanger 24 advantageously includes a v-shaped notch 34, illustrated in FIGS. 2–3, formed in the bottom surface 20 at the distal end of the bumper hanger 24 and extending partially through the plate 16 toward the top surface 18. The notches 34 allow the bumper heads 26 to be easily removed by bending when the quad flat package 12 is to be installed on a circuit board to provide additional space on the board for other components.

Each bumper head 26 each includes a distal edge 36, oriented perpendicular to the diagonal, side edges 37, 38, 39, 40, and a central aperture 44. Each side edge 38, 40 is oriented parallel to one of the plate sides 16a, 16b, 16c, 16d and lies beyond the farthest extent of the leads 14, as illustrated in FIG. 1. Advantageously, the central apertures 44 can be used to align the heat sink with a mounting structure for a mold cavity during the encapsulation process and/or with a test fixture for testing the completed quad package.

Figure 4:
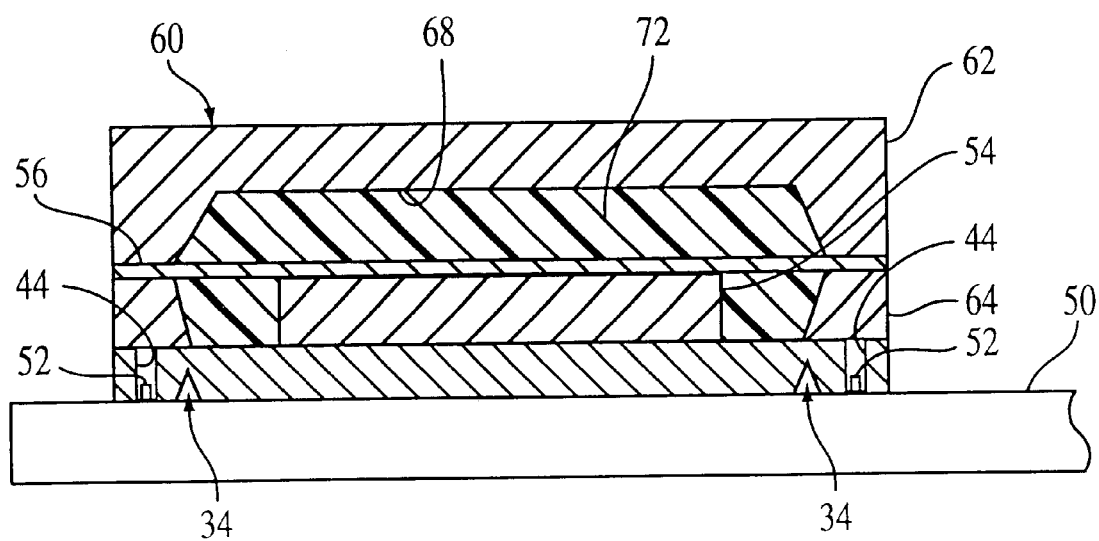
FIG. 4 is a section view taken through a mold for encapsulating a semiconductor circuit on a heat sink to form the quad flat package of FIGS. 1–2.

As illustrated in FIG. 4, during fabrication of the quad flat package the heat sink 10 is disposed on a mounting substrate 50. Preferably, a plurality of alignment pins 52 are formed on the substrate 50 and positioned to engage the apertures 44 to accurately position the heat sink 10 with respect to the substrate 50. A semiconductor device 54, with a lead frame 56 attached, is positioned in thermal contact with the heat sink 10, and a mold fixture 60, including upper and lower mold halves 62, 64 that define a mold cavity 68, is positioned to locate the semiconductor device 54 and portions of the lead frame 56 in the mold cavity 68. Encapsulant material 72 is introduced into the mold cavity 68 to encapsulate the semiconductor device 54 and portions of the lead frame 56 to form a quad flat package 12. After the quad flat package 12 is encapsulated, the upper and lower mold halves 62, 64 are removed and the quad flat package 12 is moved to a test fixture (not shown). Again, pins can be formed on the test fixture to engage the apertures 44 to align the quad flat package 12 with the test fixture. After the testing is completed, the bumper heads 26 can be broken off from the heat sink 10 by bending them at the v-shaped notch 34, and the quad flat package 12 is installed on a circuit board (not shown).

The present invention provides an improved quad flat package that takes up less space on a circuit board and has alignment features to facilitate aligning the package with a mounting substrate and/or a test fixture. Modifications can be made to the invention and equivalents substituted for described and illustrated structures without departing from the spirit or scope of the invention. Accordingly, the scope of the present invention is not to be considered as limited by the specifics of the particular structure which have been described and illustrated, but is only limited by the scope of the appended claims.

What is claimed as new and desired to be protected by Letters Patent of the United States is:

1. A method of placing an integrated circuit package onto a circuit board comprising:

forming a heat sink having a plate portion and at least one bumper, said at least one bumper extending from said plate portion and having an area of reduced thickness to facilitate removal of said at least one bumper from said plate at said area of reduced thickness;

coupling a semiconductor with said heat sink;

removing said at least one bumper from said heat sink; and installing said heat sink and said coupled integrated circuit onto said circuit board.

2. The method according to claim 1 wherein said at least one bumper includes an alignment feature for engaging a complimentary feature formed on a mounting structure.

3. The method according to claim 1 wherein said at least one bumper is attached to a corner of said plate and extends outwardly along a diagonal of said plate.

4. The method according to claim 1 further comprising positioning said heat sink and said coupled semiconductor device in a mold.

5. The method according to claim 4 further comprising introducing an encapsulant material into said mold.

6. The method according to claim 5 wherein at least some area of said at least one bumper extends past said encapsulant material.

7. The method according to claim 5 further comprising removing said mold.

8. The method according to claim 1 wherein said at least one bum per comprises a bumper hanger extending from said plate and a bumper head coupled to said bumper hanger.

9. The method according to claim 1 wherein said semiconductor includes a plurality of leads extending therefrom.

10. A circuit board comprising:

a semiconductor package having a heat sink, said heat sink having a plate portion and at least one bumper, said at least one bumper extending from said plate portion and having an area of reduced thickness to facilitate removal of said at least one bumper from said plate at said area of reduced thickness, wherein at least one of said bumpers is removed and said semiconductor package is mounted on said circuit board.

11. The circuit board of claim 10 wherein said at least one bumper includes an alignment feature for engaging a complimentary feature formed on a mounting structure.

12. The circuit board of claim 10 wherein said at least one bumper is attached to a corner of said plate and extends outwardly along a diagonal of said plate.

13. The circuit board of claim 10 further comprising an encapsulant material.

14. The circuit board of claim 13 wherein at least some area of said at least one bumper extends past said encapsulant material.

15. The circuit according to claim 10 wherein said at least one bumper comprises a bumper hanger extending from said plate and a bumper head coupled to said bumper hanger.

16. The circuit board of claim 10 wherein said semiconductor package includes a plurality of leads extending therefrom.

17. A method of placing a quad flat integrated circuit package onto a circuit board comprising:

forming a heat sink having a plate portion and a plurality of bumpers, said bumpers extending from said plate portion and said plurality of bumpers each comprising an area of reduced thickness to facilitate removal of said plurality of bumpers from said plate at said areas of reduced thickness, the plate portion being configured to receive an encapsulation layer;

thermal coupling an integrated circuit with said heat sink;

encapsulating said integrated circuit with an encapsulant material such that said encapsulant material is in contact with a portion of said heat sink which does not include any part of said plurality of bumpers which extend beyond said reduced thickness areas;

removing said bumpers from said heat sink; and placing said encapsulated integrated circuit having said heat sink with removed bumpers onto a circuit board.

* * * * *